(12) United States Patent
Schmidig

(10) Patent No.: US 11,933,867 B2
(45) Date of Patent: Mar. 19, 2024

(54) TEMPERATURE CONTROL FOR AN NMR SAMPLE TUBE

(71) Applicant: Bruker Switzerland AG, Faellanden (CH)

(72) Inventor: Daniel Schmidig, Schaffhausen (CH)

(73) Assignee: BRUKER SWITZERLAND AG, Faellanden (CH)

( * ) Notice: Subject to any disclaimer, the term of this patent is extended or adjusted under 35 U.S.C. 154(b) by 138 days.

(21) Appl. No.: 17/720,473

(22) Filed: Apr. 14, 2022

(65) Prior Publication Data

US 2022/0244330 A1 Aug. 4, 2022

Related U.S. Application Data

(63) Continuation of application No. PCT/EP2020/078144, filed on Oct. 7, 2020.

(30) Foreign Application Priority Data

Oct. 18, 2019 (DE) .................. 10 2019 216 108.1

(51) Int. Cl.
*G01R 33/31* (2006.01)
*G05D 7/06* (2006.01)

(52) U.S. Cl.
CPC .......... *G01R 33/31* (2013.01); *G05D 7/0635* (2013.01)

(58) Field of Classification Search
CPC .................................................. G01R 33/31
See application file for complete search history.

(56) References Cited

U.S. PATENT DOCUMENTS 5,192,910 A 3/1993 Hepp et al.
6,972,568 B2 12/2005 Haner et al.
(Continued)

FOREIGN PATENT DOCUMENTS

CN 1846144 A 10/2006
DE 40 18 734 C2 10/1992
(Continued)

*Primary Examiner* — G. M. A Hyder
(74) *Attorney, Agent, or Firm* — Edell, Shapiro & Finnan, LLC

(57) ABSTRACT

Temperature control system for an NMR sample tube (22) using a temperature control device (20) with an interior (21) delimiting a cylindrical wall (39) in the radially outward direction and a plurality of flow channels for temperature-controlling fluid running radially around the interior, of which the radially outermost flow channel (28) is delimited to the outside by a wall (29), and the innermost flow channel (31) by a wall (30) and connected to one another by a first fluid passage (34). The innermost flow channel has a second fluid passage (36) to the interior and the outermost flow channel has a fluid inlet (32). During operation, the wall delimiting the interior in the radially outward direction is temperature-controlled by the fluid so that: abs $(T_U - T_W)$ ≤ abs $(T_U - T_{FD})$, where $T_W$ is the wall temperature, $T_{FD}$ is the fluid temperature at the first fluid passage and $T_U$ is the ambient temperature.

23 Claims, 5 Drawing Sheets

(56) References Cited

U.S. PATENT DOCUMENTS

| | | | |
|---|---|---|---|
| 8,847,595 B2 | 9/2014 | Grossniklaus et al. | |
| 9,482,729 B2 | 11/2016 | Gisler et al. | |
| 2007/0007963 A1 | 1/2007 | Kawasaki et al. | |
| 2011/0284192 A1* | 11/2011 | Grossniklaus | G01R 33/31 |
| | | | 165/172 |
| 2014/0084928 A1 | 3/2014 | Gisler et al. | |

FOREIGN PATENT DOCUMENTS

| | | |
|---|---|---|
| DE | 10 2010 029 080 B4 | 5/2013 |
| DE | 10 2012 217 601 B4 | 10/2016 |
| EP | 0461493 A2 | 12/1991 |
| EP | 2388609 A1 | 11/2011 |
| JP | 855131758 A | 10/1980 |

* cited by examiner

TEMPERATURE CONTROL FOR AN NMR SAMPLE TUBE

CROSS REFERENCE TO RELATED APPLICATIONS

This is a Continuation of International Application PCT/EP2020/078144, which has an international filing date of Oct. 7, 2020, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2019 216 108.1 filed on Oct. 18, 2019.

FIELD OF THE INVENTION

The present invention relates generally to the temperature control of NMR sample tubes, in particular an improved fluid temperature control in a countercurrent arrangement

BACKGROUND

More particularly, the invention relates to the temperature control of an NMR sample tube, in particular a method and a device for controlling the temperature of an NMR sample tube using a temperature control device in which, around an interior delimited in a radially outward direction by a cylindrical wall, a plurality of nested flow channels for the fluid to be temperature-controlled running radially around the interior, are formed for receiving the NMR sample tube. Of these nested flow tubes, the radially outermost flow channel is delimited by an axial wall, and the radially innermost flow channel is delimited by an axial wall, each in the outward radial direction, in which case the adjacent flow channels are each connected with one another by a first fluid passage at one axial end, wherein the radially innermost flow channel has a second fluid passage to the interior, the radially outermost flow channel having a fluid inlet at one axial end, and the temperature-controlling fluid is guided through the flow channels.

Such a temperature control device and a method for its operation is known from DE 10 2010 029 080 B4 or from U.S. Pat. No. 8,847,595 B2 (=reference [1]).

Nuclear magnetic resonance (=NMR) enables basic and powerful instrumental analysis methods. In NMR spectroscopy, high-frequency (=HF) pulses are radiated into a test sample that is arranged in a strong, static magnetic field, and the HF response of the test sample is measured. The information is obtained integrally across a certain area of the test sample (the active volume). The temperature of the test sample has a fundamental influence on the results of the NMR measurements. For high-quality measurements, the temperature of the sample is typically adjusted with the help of a temperature control unit and kept as constant as possible in terms of space and time across the active measurement volume. NMR measurements are therefore typically carried out with either heated or cooled samples. The spatial temperature gradient across the active measurement volume and the stability of the sample temperature over time have a significant influence on the quality of the NMR measurements.

In most of the common NMR measuring methods, the test sample, i.e., the substance from which the analytical information is to be obtained, is arranged in a so-called NMR sample tube. Typical NMR sample tubes have an outer diameter of 5 mm and a length of approximately 18 cm, with the active volume extending across approximately 25 mm in length. In the NMR spectrometer, the NMR sample tube is held at one (usually the upper) end, and the other free (usually the lower) end is surrounded by HF coils, which are often integrated into the temperature control device, and protrudes into the temperature control device.

Direct Flow

In conventional temperature control devices, a temperature-controlled fluid, usually a gas such as air or nitrogen but in some cases also a liquid, flows around the sample tube with the test sample, at least in the area of the active volume, as described in, e.g., DE 10 2012 217 601 B4 or U.S. Pat. No. 9,482,729 B2 (=reference [2]). These patents propose, in particular, an electronic control of the sample temperature.

In the simplest case, the temperature control device forms a chamber into which the free end of the sample tube protrudes through an opening. A fluid flow is then introduced into the chamber, directed at the free end of the sample tube, and guided within the chamber in the axial direction along the sample tube. Such simple temperature control devices, however, have relatively high temperature gradients in the fluid flow or over the length of the active volume of the NMR sample tube since the fluid flow approaches its temperature as it passes through the chamber (e.g., cools down in the case of a heating temperature control fluid flow). Heat flows, in particular, across the outer wall of the temperature control device in which the fluid flows and also across the NMR sample tube itself in the direction of a tube holder (fixation).

The direct flow principle is mainly used today in the area of cryogenically cooled samples which, due to their design, must have excellent thermal insulation from the sample space to the surrounding environment. As a result, the heat loss in the air flowing around the sample is relatively small, which in turn results in a small temperature gradient across the sample. As soon as this thermal insulation is no longer present or significantly reduced, the direct flow principle becomes unusable. The heat loss in the air that flows around the sample becomes too great. This also makes the temperature gradient across the sample too large.

Countercurrent Principle

In order to reduce the temperature gradient in the fluid stream surrounding the NMR sample tube, known temperature control devices are designed according to the countercurrent principle, as already described in DE 40 18 734 C2 and U.S. Pat. No. 5,192,910 A (=reference [3]) and illustrated therein, i.e., in FIG. 2.

Therein, a fluid flow is first guided in an outer, annular flow channel in a first axial direction parallel to the sample tube, then deflected and returned in the opposite axial direction in an inner flow channel, then deflected again and guided directly along the sample tube and to the opening through which the NMR sample tube protrudes into the interior of the temperature control device. The walls between the flow channels and to the interior act as heat exchangers so that the temperature gradient in the fluid flow is reduced directly on the sample tube.

If the difference between the ambient temperature and the sample space temperature in the temperature control device becomes significant, a fluid flow operating in accordance with the countercurrent principle is able to reduce the temperature gradient across the sample. The countercurrent principle as described in reference [3] is unable, however, to minimize the temperature gradient or, in the best case, to make it disappear completely.

Although the countercurrent principle is basically to be regarded as an improvement on the direct flow principle, it still has some disadvantages.

In the event that the area around the temperature control device is colder than the temperature control fluid, the sample becomes warmer in the lower area than in its upper area due to the temperature control fluid since this area is in closer thermal contact with the environment. If the environment is colder than the sample space, the temperature control makes the sample warmer at the bottom than at the top. The axial temperature gradient is correspondingly opposite in both cases.

Both situations have the considerable disadvantage that convection is favored in the sample, which generally leads to locally undefined temperature conditions within the sample tube and thus to a disruption of an NMR measurement signal.

Improved Countercurrent Principle

The applicant has used the countercurrent principle successfully in its NMR samples since 2001 and from 2010 in an improved version, as described in more detail in the reference [1] cited at the beginning. This improved principle works with an additional sheath flow and at least delivers a lower temperature gradient in the sample tube while being able to provide a high temperature control performance at the same time. It therefore works satisfactorily even without the technically more complex electronic temperature control and has been used in many NMR spectrometers ever since.

A major disadvantage of the countercurrent principle, as described in references [1] or [3], is that the temperature gradient in the NMR sample tube cannot generally be reversed.

As soon as the (average) sample temperature is to be raised above the ambient temperature, the temperature control fluid, which flows through the fluid inlet into one axial end of the radially outermost flow channel, cools on its way through this flow channel (usually upwards) so that, when it has reached the other axial end of the radially outermost flow channel in the area of the first fluid passage, it is already significantly colder than in the area of the fluid inlet. As the temperature control fluid continues to flow through the interior, a temperature gradient is formed across the sample (in the present case, cold above and warm below). In the opposite case of an intended sample cooling with a temperature control fluid, which has a lower temperature than the surroundings when entering the fluid inlet, the fluid heats up accordingly on the path to the area of the second fluid passage, and an axial temperature gradient is formed in the sample tube, which is, however, opposite compared to the previously discussed case.

SUMMARY

Objects of the Invention

In contrast, one object of the present invention is to improve a temperature control system as well as a method of the type described in the introductory section in a relatively simple manner, so as to avoid the above-discussed disadvantages of known assemblies of the type in question. In particular, a temperature control method improved in accordance with the present invention is intended to enable increased temperature stability in comparison to devices using the prior art, and to offer the ability to further minimize the axial temperature gradient in the sample tube and to keep it stable, preferably close to zero.

BRIEF DESCRIPTION OF THE INVENTION

According to one aspect of the present invention, this object, which is relatively demanding and complex when viewed in detail, is achieved in a surprisingly simple and effective manner in that, in a temperature control device for an NMR sample tube with the features defined in the introductory section, the cylindrical wall that delimits the interior during operation in the radially outward direction during operation is temperature-controlled by the temperature-controlling fluid such that the following relation of the absolute difference values applies to the temperature $T_W$ of the cylindrical wall and the temperature $T_{FD}$ of the temperature-controlling fluid at the first fluid passage in relation to the ambient temperature $T_U$ radially outside the axial wall delimiting the radially outermost flow channel in the radially outward direction:

$$\text{abs}(T_U-T_W) \leq \text{abs}(T_U-T_{FD}).$$

An important object of the present invention is to achieve the most "sensitive" temperature control of the NMR sample tube possible with the smallest possible temperature gradient in the active volume. It is particularly advantageous if embodiments according to the invention achieve a reversal of the temperature gradient of the fluid flow along the outside of the sample compared to the temperature gradient in the sample. It is possible to uniformly control the sample temperature by setting $T_{FD}$ in relation to $T_U$ and $T_W$.

According to further aspects of the invention, this object is achieved, in particular, by the special temperature control of the cylindrical wall delimiting the interior comprising the NMR sample tube in the radially outward direction. This special temperature control can be achieved in different ways and with different measures, as will be explained in more detail below.

Compared to prior-art countercurrent temperature control systems, in which the above-described effect of cooling a heating temperature control fluid or heating a cooling temperature control fluid must generally always occur (which, in turn, necessarily results in a corresponding axial temperature gradient along the cylindrical wall delimiting the interior space in the radially outward direction being built up by the temperature-regulating fluid, which this wall in turn at least partially transfers to the NMR sample tube), the present invention minimizes this effect so that in the best case no such axial temperature gradient whatsoever occurs any more in the NMR sample.

Preferred Embodiments and Developments of the Invention

One embodiment of the method according to the invention in which the temperature control of the cylindrical wall which surrounds the NMR sample tube is brought about by controlling the temperature of the axial wall that delimits the radially innermost flow channel in the radially outward direction is particularly preferred. This radially innermost flow channel is delimited in the radially inward direction especially by the cylindrical wall surrounding the NMR sample tube. Therefore, the temperature control fluid that flows through this flow channel can cause a temperature compensation between the radially outer and the opposite radially inner wall of the flow channel through the radial (and also the axial) heat flow within the flowing fluid. The axial wall can be temperature-controlled in different ways. One preferred embodiment of this type would be heating elements (resistance heating, Peltier element) that are attached to the wall or integrated into the wall. Another preferred embodiment comprises controlling the temperature of the wall through heat conduction via materials that are good conductors of heat and which are in thermal contact with the wall or via "heat pipes." This multitude of possibilities for controlling the temperature of the wall renders the embodiment according to the invention technically feasible even in complex cases and makes it possible to consider various other conditions in the sample area as well. Furthermore, it is advantageous to thermally insulate the part of the wall lying radially on the outside so that the fluid is essentially temperature-controlled in the radially inward direction.

The following applies to further method variants that are advantageous in practice: $2 \cdot abs(T_U - T_W) \leq abs(T_U - T_{FD})$, in particular $10 \cdot abs(T_U - T_W) \leq abs(T_U - T_{FD})$, particularly preferably $100 \cdot abs(T_U - T_W) \leq abs(T_U - T_{FD})$. Due to a greater temperature difference between the environment and the temperature control fluid, a target temperature can be achieved faster.

One variant of the type according to the invention described above that is likewise of particular advantage for operating a temperature control device is a device in which the radially outermost flow channel comprises an outer compartment and an inner compartment in which the temperature-controlling fluid flows in the same direction, characterized in that, during operation, more temperature-controlling fluid per unit of time is fed to the inner compartment of the radially outermost flow channel than to the outer compartment, preferably at least twice as much, in particular at least ten times as much, particularly preferably more than a hundred times as much. A corresponding further development is particularly advantageous because the described division of the fluid flows can be used to reverse or minimize the temperature gradient in the sample area. This ensures that the fluid in the inner compartment has a higher heat transport share when the two fluid flows meet.

Advantageous further developments of this method for the operation of a temperature control device in which the fluid inlet is split into at least two separate inlets, the first inlet opening into the outer compartment of the radially outermost flow channel and the second inlet opening into the inner compartment, are characterized in that the ratio of the fluid quantities per unit of time that are guided through the first inlet and through the second inlet is regulated, in particular with a valve device.

This is particularly advantageous because the temperature gradient in the NMR sample can be controlled with respect to sensitivity by adjusting the quantities of fluid through the corresponding inlets. The valve device can be located both inside and outside the temperature control device, which considerably simplifies its implementation in practice. To regulate the temperature gradient, the temperature control device, therefore, does not have to be removed from the NMR magnet that generates the required homogeneous magnetic field.

The regulation can take place without opening the temperature control device. This makes it possible to set the temperature gradient when the temperature control device is in operation, in particular while the temperature control device is temperature-controlled at very high or very low temperatures. With the method according to the invention and the valve device described, it is also possible to intentionally generate a temperature gradient in the sample. This could be the case, for example, if the goal is to ensure that no convection occurs in the sample volume and therefore intentionally generates a temperature gradient in the temperature control fluid flowing past that is slightly higher in the lower area of the sample.

In the method according to the invention, a temperature-controlling fluid flow can be guided according to the countercurrent principle in nested flow channels alternating along the direction of the axial extension of the NMR sample tube and in opposite directions, with a temperature-regulating fluid flow according to the sheath flow principle being used in addition to the fluid flow according to the countercurrent principle, and with the fluid flow operating according to the sheath flow principle is guided in at least a part of the area in which the fluid flow is guided according to the countercurrent principle and surrounds at least a part of the NMR sample tube. The fluid flow according to the countercurrent principle and the fluid flow according to the sheath flow principle can be guided completely separately, and, in particular, regulated and temperature-controlled separately.

A class of temperature control devices for an NMR sample tube used to carry out the method according to the invention described above also falls within the scope of the present invention in which, around an interior delimited in a radially outward direction by a cylindrical wall, a plurality of nested flow channels for the fluid to be temperature-controlled running radially around the interior, are formed for receiving the NMR sample tube of which the radially outermost flow channel, which is delimited by axial walls, comprises an outer compartment and an inner compartment in which the temperature-controlling fluid flows in the same direction, wherein the temperature-controlling device is closed in a first axial end region to the interior and in which in an opposite, second axial end region, it is open toward the interior to enable the NMR sample tube to be inserted into the interior, wherein adjacent flow channels in a countercurrent area are each connected to one another with a first fluid passage at one axial end such that the direction of flow of a fluid in the radially outermost flow channel reverses to the adjacent radially innermost flow channel in the counterflow area with the radially outermost flow channel having a fluid inlet at one axial end and the radially innermost flow channel, which is delimited by the axial walls, having a second fluid passage to the interior at one axial end that faces the first axial end region that is closed.

According to the invention, this class of temperature control devices is characterized in that the outer compartment of the radially outermost flow channel is geometrically designed so that it is in full thermal contact with both the radially inner axial wall and the radially outer axial wall such that the outer compartment surrounds the inner compartment of the radially outermost flow channel in such a way that the inner compartment is neither in thermal contact with the radially inner axial wall nor with the radially outer axial wall, and the inner compartment of the radially outermost flow channel is delimited by an axial partition, which starts from the closed first axial end region and extends only so far in the axial direction that it is axially spaced from the second axial end region. This is particularly advantageous because it is possible to achieve a reversal or minimization of the temperature gradient in the sample area with the described division of the fluid flows.

Embodiments of this class of temperature control devices in which the outer compartment of the radially outermost flow channel is designed so that the flow rate of the temperature-controlling fluid through the outer compartment is less than through the inner compartment, preferably at the most half as large, in particular at least ten times less, and particularly preferably the flow rate of the temperature-controlling fluid through the outer compartment reaches zero. The fact that the temperature gradient in the sample can be adjusted via the flow speeds in the corresponding compartments makes it possible to design the temperature control device in such a way that the temperature gradient is minimal at a given sample temperature.

Embodiments of this class of temperature control devices in which the outer compartment of the radially outermost flow channel has a larger flow cross section transversely to the flow direction of the temperature-controlling fluid than the inner compartment, preferably at least a twice as large flow cross section, in particular at least ten times the flow cross section, are advantageous as well.

By choosing the cross sections of the flow channels so that the resulting flow speeds are correspondingly smaller or larger, the temperature control device can be designed so that the temperature gradient becomes minimal at a given sample temperature.

Further advantageous embodiments are characterized in that the outer compartment and the inner compartment of the radially outermost flow channel are designed so that the average flow rate of the temperature-controlling fluid through the outer compartment of the radially outermost flow channel is smaller than through the inner compartment, preferably at most half as large, in particular at least ten times less, particularly preferably approaches zero. This is particularly advantageous because the described compartmentalization of the fluid flows can be used to reverse or minimize the temperature gradient in the sample area.

The inner compartment of the radially outermost flow channel and also the outer compartment can extend in the axial direction across the entire length of the radially outermost flow channel up to the first fluid passage.

Embodiments of the temperature control device according to the invention, which are characterized in that the flow contact between the inner compartment and the outer compartment of the radially outermost flow channel can be set variably, are advantageous as well.

Preferably, the axial partition which delimits the inner compartment of the radially outermost flow channel has recesses, in particular in the form of variably closable holes, through which flow contact can be established between the inner compartment and the outer compartment. This means that the effective axial length of the inner compartment can basically be varied virtually. This virtual variation of the effective axial length of the inner compartment makes it possible to set the temperature gradient in the sample area particularly finely, i.e., in a particularly sensitive manner. It is, in particular, conceivable to select the number of closed holes during the production of the temperature control device so that the temperature gradient in the sample area becomes minimal. This is a surprisingly simple and effective method of setting the temperature gradient in the sample area during the production of the temperature control device.

Another advantage of this embodiment is that it makes a mechanism possible that allows the number of closed holes to be adjusted from the outside. This gives the user the opportunity to set and change the temperature gradient in the sample area while the temperature control device is in operation.

Alternatively or in addition, it is possible to design the axial partition, which delimits the inner compartment of the radially outermost flow channel, in other embodiments of this class of temperature control devices so that it causes thermal insulation from the outer compartment and has a heat transfer coefficient of less than 4 W/(m²K), which has proven itself in practice.

An embodiment in which the inner compartment of the radially outermost flow channel is designed as a capillary with a closed partition, a capillary segment or a completely radially circumferential capillary channel is particularly preferred. Designing the flow channels as capillaries makes them, above all, technically easy to realize while retaining all the other advantages described. A corresponding embodiment is also particularly advantageous because it makes it possible to achieve a reversal or minimization of the temperature gradient in the sample area.

Embodiments which are characterized in that the fluid inlet is split into at least two separate inlets with the first inlet opening into the outer compartment of the radially outermost flow channel and the second inlet opening into the inner compartment and in that preferably the flow rate per time unit or the temperature of the temperature-controlling fluid of the fluid flowing through the first inlet into the outer compartment can be regulated separately from the fluid flowing through the second inlet into the inner compartment are particularly advantageous as well. This is particularly advantageous because the corresponding inlets can regulate the temperature gradient in the NMR sample by regulating the fluid volumes.

Preferred developments of these embodiments comprise a valve device for regulating the fluid flows through the first inlet and through the second inlet. These developments are particularly advantageous because the corresponding inlets can regulate temperature gradient in the NMR sample regulating the fluid volumes. The valve device can be located both inside and outside the NMR sensor, which considerably simplifies implementation. The regulation can take place without the temperature control device being opened. This makes it possible to set the temperature gradient during operation of the temperature control device, in particular while it is being heated to very high or very low temperatures. With the method and the valve device described, it is also possible to intentionally generate a temperature gradient in the sample. This could be the case, for example, if the goal is to ensure that no convection occurs in the sample volume and therefore intentionally generates a temperature gradient in the temperature control fluid flowing past that is slightly higher in the lower area of the sample.

An alternative class of embodiments of the temperature control device according to the invention is based on a generic device in which, around an interior delimited in a radially outward direction by a cylindrical wall, a plurality of nested flow channels for the fluid to be temperature-controlled running radially around the interior, are formed for receiving the NMR sample tube of which the radially outermost flow channel is delimited by an axial wall, and the radially innermost flow channel is delimited by an axial wall in the outward radial direction. This variant of the invention is characterized in that a heating device and/or a cooling device is connected to the axial wall in a thermally conductive manner.

In practice, the countercurrent area of the temperature control device according to the invention will comprise exactly two nested flow channels of which the radially outer channel comprises an outer compartment and an inner compartment.

The first axial end region of the temperature control device generally comprises a lower terminating piece through which the fluid inlet leads. In turn, the second axial end region at the opposite end of the temperature control device comprises a corresponding upper terminating piece, which can be designed as a closed cover, but may also have a fluid outlet through which a partial flow of the temperature-controlling fluid that flowed from the fluid inlet through the radially outermost flow channel can escape to the outside of the temperature control device. The fluid inlet and/or a fluid outlet in the terminating piece of the second axial end region and/or at least one of the two fluid passages can be formed by an annular gap and/or by several openings symmetrically distributed around a central axis of the interior.

The temperature control device according to the invention is normally part of an NMR probe head. As is generally the case, this includes a test sample chamber which receives a test sample during operation and can optionally be made of a material with low thermal conductivity. This test sample chamber is part of the temperature control device according to the invention described here. The probe head also comprises a first transmitting/receiving coil which surrounds the test sample chamber or is surrounded by it. The measuring head preferably also comprises a network for tuning different resonance frequencies on the first transmitting/receiving coil. Furthermore, the probe head optionally comprises a second transmitting/receiving coil to which further measuring coils can be tuned, for example the locking frequency. In another embodiment, the measuring head comprises a further test sample with a substance that is detected by a second or third transmitting/receiving coil and is used as a reference signal for the lock.

Further advantages of the invention can be found in the descriptions and the drawings. Likewise, according to the invention, the features that are mentioned above and set out in the following can each be used individually per se or together in any combinations. The embodiments shown and described are not to be understood as an exhaustive list but instead are of an exemplary nature for describing the invention.

BRIEF DESCRIPTION OF THE DRAWINGS

The invention is illustrated in the drawings and is explained in more detail with reference to exemplary embodiments.

Shown in the drawings are.

DETAILED DESCRIPTION

The present invention relates to the temperature control of NMR sample tubes with increased temperature stability and minimized axial temperature gradients in the sample tube.

Figure 3:
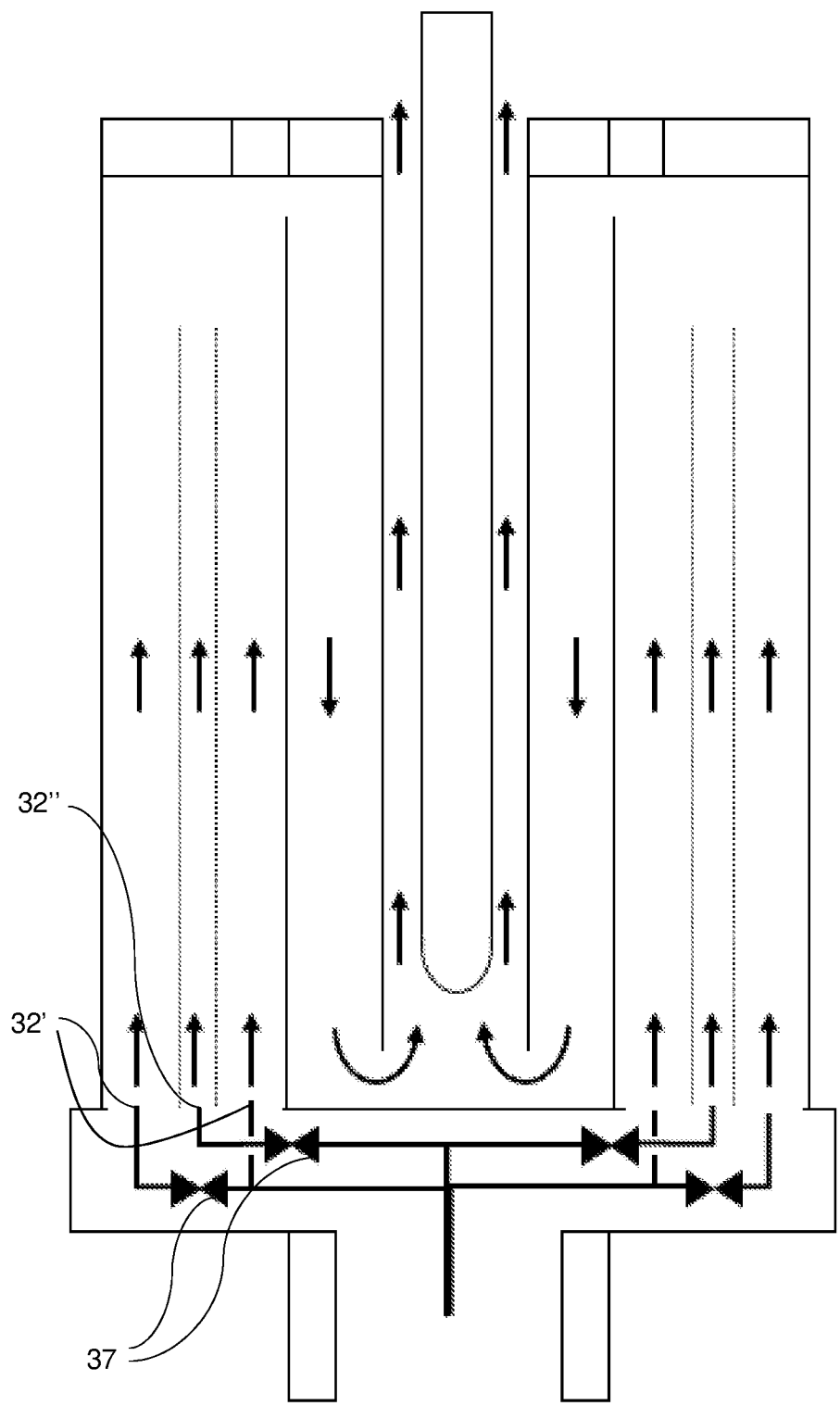
FIG. 3 an embodiment as in FIG. 1 or 2 but with a valve device for regulating the fluid flows through the first inlet into the outer compartment and through the second inlet into the inner compartment.
Figure 4A:
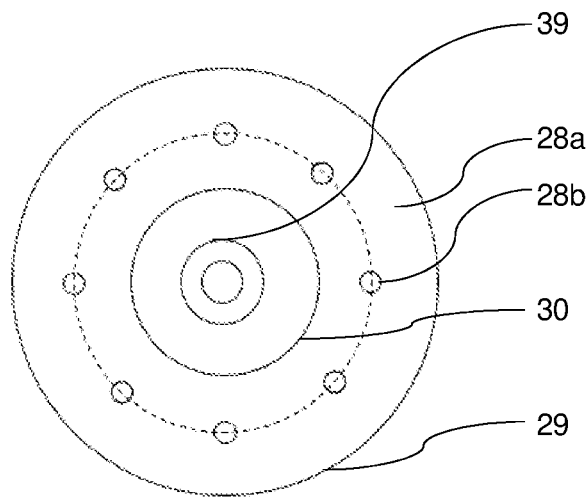
FIG. 4A a schematic horizontal sectional view perpendicular to the z-axis through an embodiment with the radially outermost flow channel having an inner compartment, which is composed of a plurality of capillaries arranged azimuthally around the z-axis.
Figure 4B:
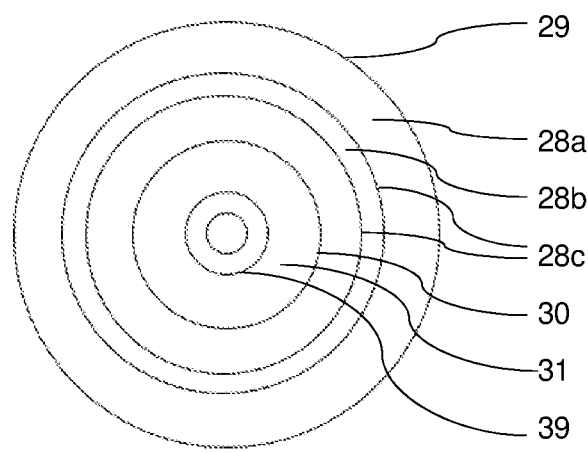
FIG. 4B a schematic horizontal sectional view through an embodiment with an inner compartment formed as an annular capillary running around the z-axis.
Figure 4C:
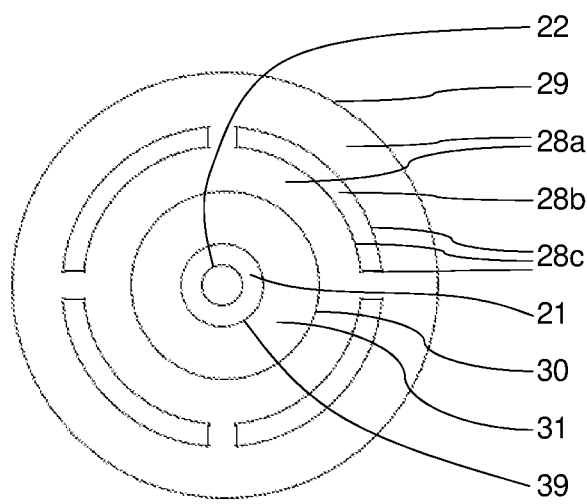
FIG. 4C a schematic horizontal sectional view through an embodiment with an inner compartment formed as an annular capillary running around the z-axis, which is divided into four azimuthal, separated segments.
Figure 5A:
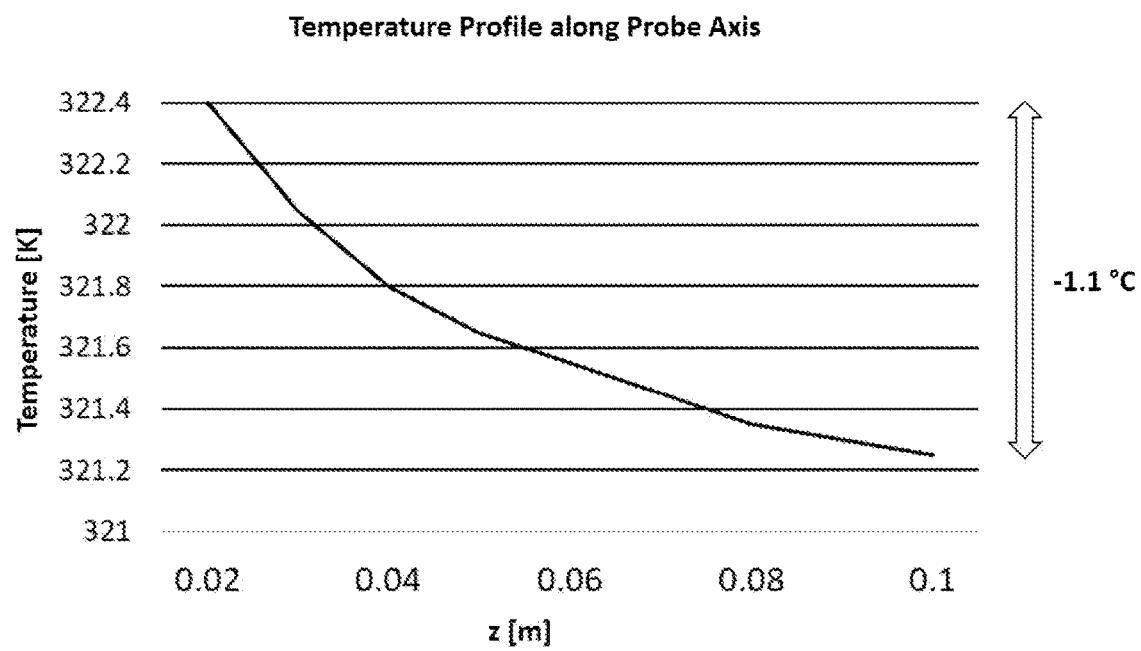
FIG. 5A a calculated axial temperature profile in the NMR sample tube of a temperature control system according to the prior art along the z-axis.
Figure 5B:
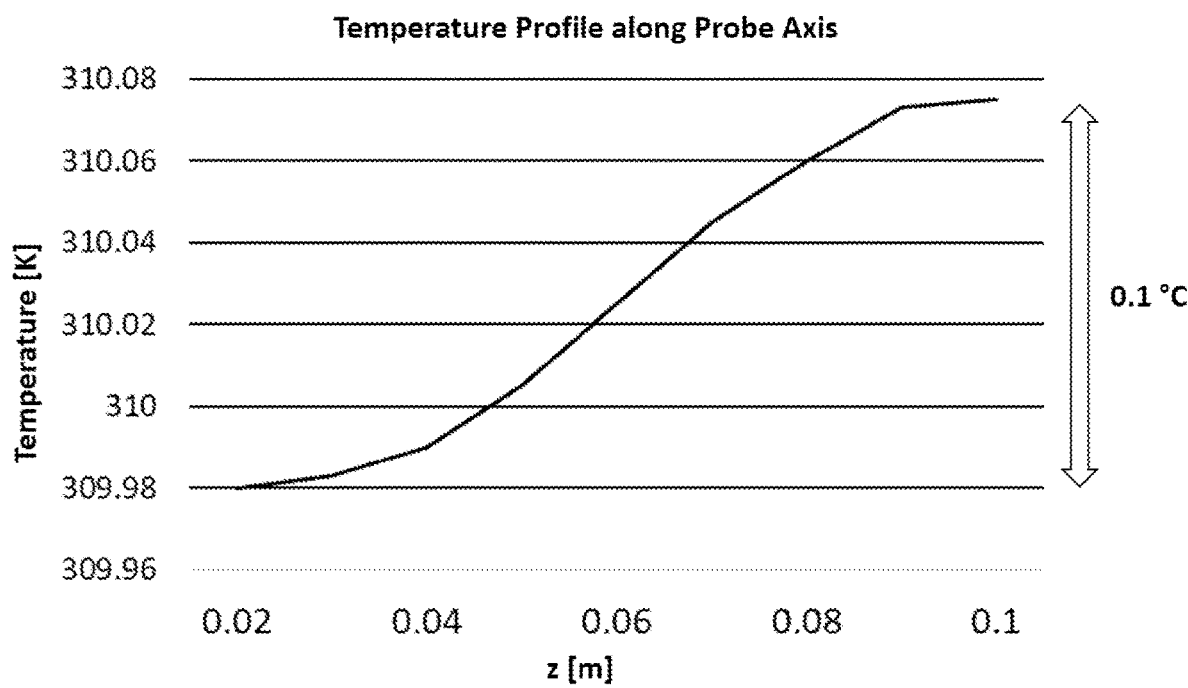
FIG. 5B a calculated axial temperature profile in the NMR sample tube of a temperature control system that, in terms of its dimensions, is comparable to FIG. 5A but is according to the invention.

FIGS. 1 to 4C of the drawings each show in a schematic view in different detail preferred embodiments of the temperature control system according to the invention while FIG. 5B shows the axial temperature gradient in the sample tube of an arrangement according to the invention, and FIG. 5A shows a generic arrangement according to the prior art for comparison purposes.

NMR sample tubes are usually operated, in particular measured, at a defined temperature. This temperature is set using the NMR spectrometer and should be kept as stable as possible. It is necessary to keep the temperature constant because the spectra generated in NMR technology significantly depends on the temperature of the substance to be tested in the sample tube, which means that changes in the ambient temperature are ultimately included in the measurement result, which can lead to a displacement of individual measured frequency lines. Depending on the experiment, these effects are more or less disruptive and falsify the measurement. In order to obtain similar contributions to the alternating magnetic field from all parts of the active volume in the NMR sample tube, a temperature that is as uniform as possible in the entire active volume is required, i.e., the temperature gradient in the NMR sample tube, especially in the axial direction, should be small and close to zero, if possible.

Figure 1:
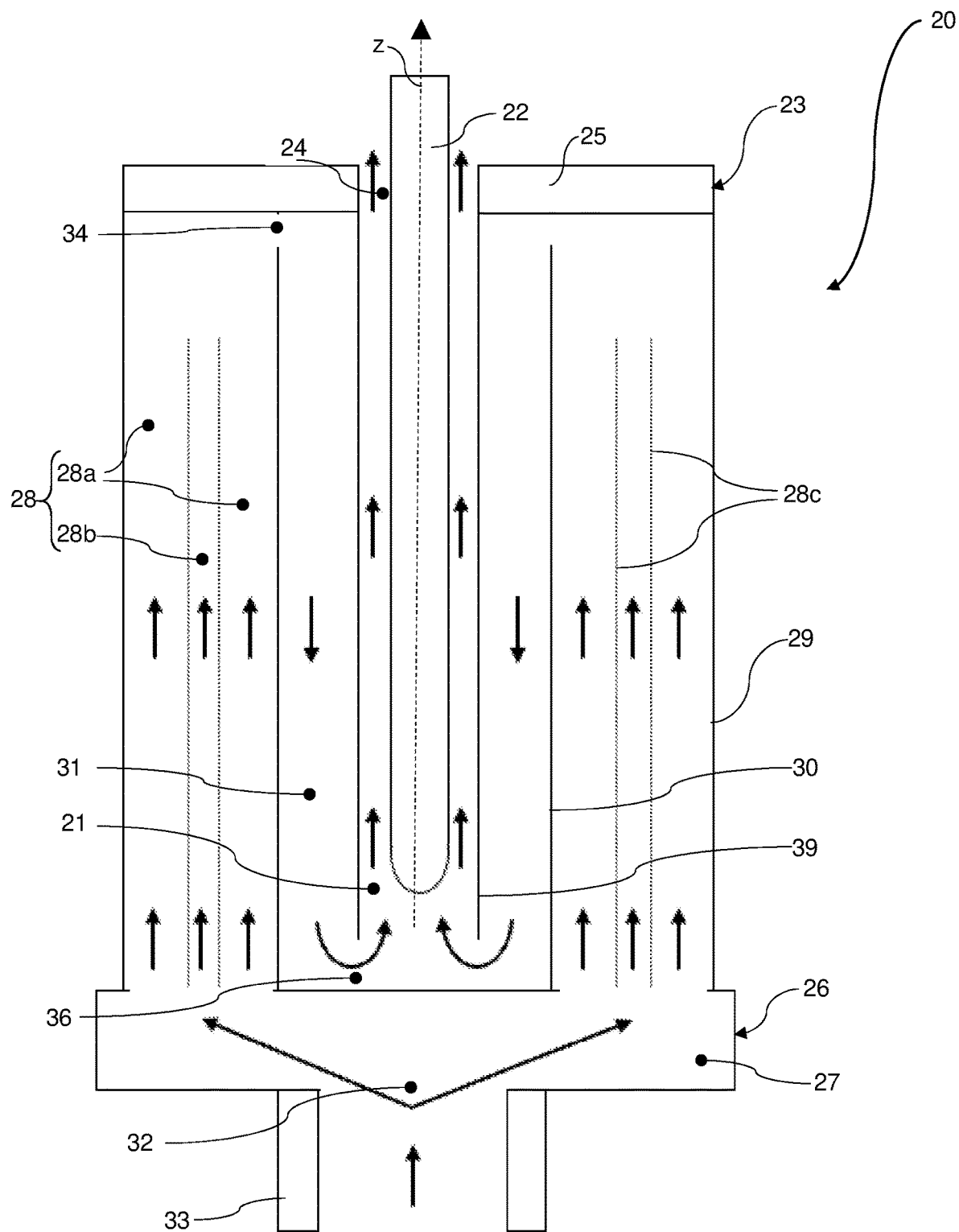
FIG. 1 a schematic vertical sectional view of a first embodiment of a temperature control system according to the invention with a temperature control of the axial wall delimiting the radially innermost flow channel in the radially outward direction with the radially outermost flow channel comprising an outer and an inner compartment.
Figure 2:
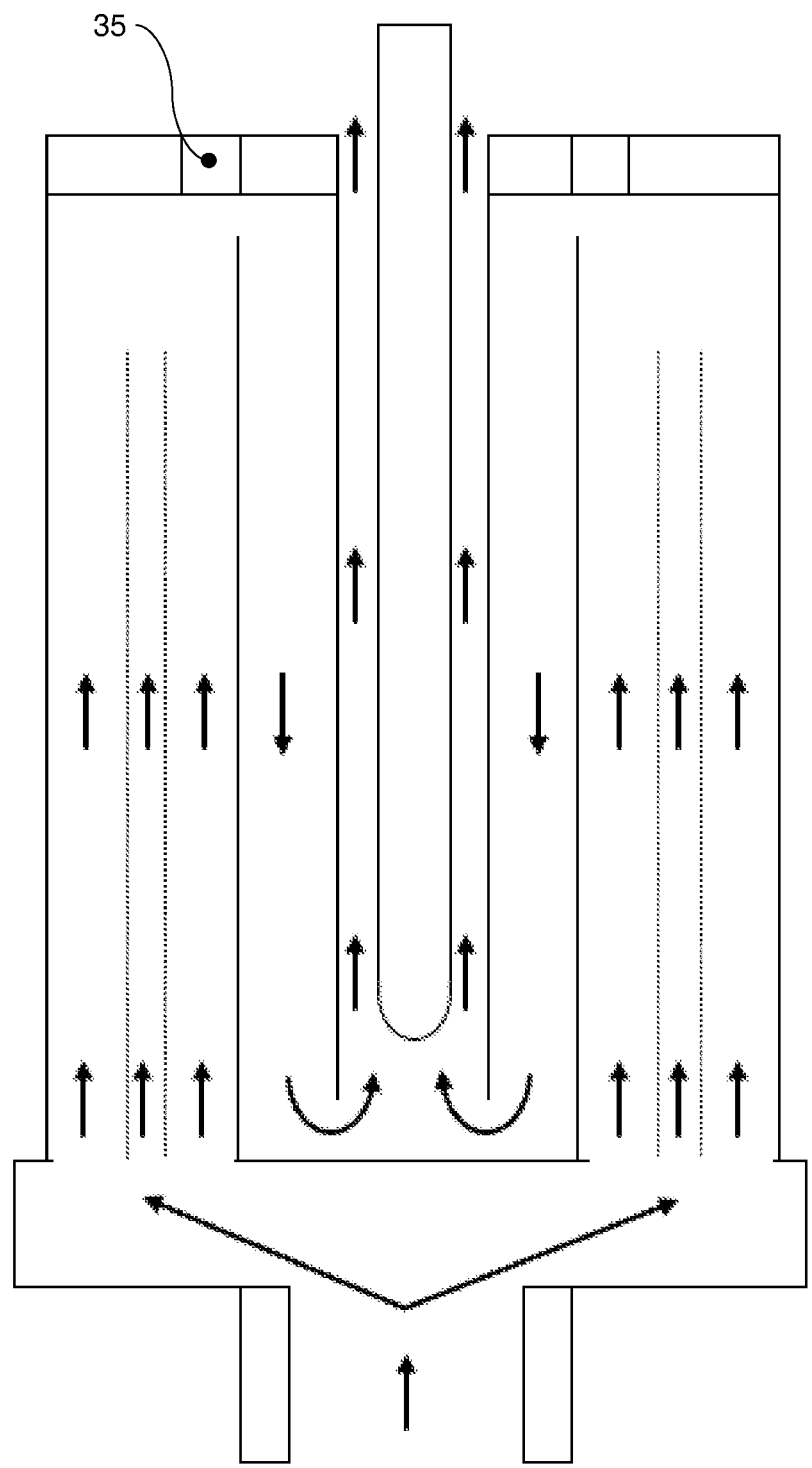
FIG. 2 an embodiment as in FIG. 1 but with one fluid outlet in the upper terminating piece of the second axial end region.

FIGS. 1 to 3 each show an embodiment of a temperature control device 20 according to the invention for controlling the temperature of an NMR sample tube 22 with a longitudinal axis z. Around an interior 21 of the device 20 delimited in the radially outward direction by a cylindrical wall 39, a plurality of flow channels, nested in the radially outward direction, for the fluid to be temperature-controlled running radially around the interior 21 are formed for receiving the NMR sample tube 22. The radially outermost flow channel 28 of these flow channels is delimited by a radially outer axial wall 29 and the radially innermost flow channel 31 is delimited by a radially inner axial wall 30. In a countercurrent area, adjacent flow channels 28, 31 are each connected to one another at one axial end with a first fluid passage 34 such that the flow direction of a fluid flow in the radially outermost flow channel 28 reverses to the adjacent, radially innermost flow channel 31 in the countercurrent area. The radially innermost flow channel 31 comprises a second fluid passage 36 to the interior 21 with the radially outermost flow channel 28 having a fluid inlet 32 at one axial end into which the temperature-controlling fluid flows from a shared inlet 33 and wherein the temperature-controlling fluid is guided through the flow channels 28, 31.

The radially outermost flow channel 28, which is delimited by axial walls 29, 30, comprises in the illustrated embodiments an outer compartment 28a and an inner compartment 28b in which the temperature-controlling fluid flows in the same direction (sheath flow principle).

The temperature control device 20 is formed in a first axial end region 26 that is closed to the interior 21 and in an opposite second axial end region 23 for the introduction of the NMR sample tube 22 into the interior 21 that is open to the interior 21. The first axial end region 26 has a lower terminating piece 27 through which the fluid inlet 32 leads. The second axial end region 23 at the opposite end of the temperature control device 20 has, in turn, a corresponding upper terminating piece 25, which can be designed as a closed cover, as shown in FIG. 1. The free end of the NMR sample tube 22 protrudes through an opening 24 in the upper terminating piece 25 into the interior 21. A fluid flow is then introduced into the chamber, directed at the free end of the sample tube, and guided within the chamber in the axial direction along the sample tube and toward the opening 24.

In other embodiments (cf., for example, FIGS. 2 and 3), the upper terminating piece 25 may also comprise a fluid outlet 35 through which a partial flow of the temperature-controlling fluid that flowed from the fluid inlet 32 through the radially outermost flow channel 28 can escape to the outside of the temperature control device 20. The exact mode of operation and additional advantages of such a fluid outlet 35 in the upper terminating piece 25 are described in detail in reference [1].

The fluid inlet 32 and/or a fluid outlet 35 in the upper terminating piece 25 of the second axial end region 23 and/or at least one of the two fluid passages 34, 36 may be formed by an annular gap and/or by several openings symmetrically distributed around a central axis of the interior.

The temperature control system according to the invention is characterized in that, when in operation, the cylindrical wall 39 delimits the interior 21 in the radially outward direction such that the following relation of the absolute difference values applies to the temperature $T_W$ of the cylindrical wall 39 and the temperature $T_{FD}$ of the temperature-controlling fluid at the first fluid passage 34 in relation to the ambient temperature $T_U$ radially outside the axial wall 29 delimiting the radially outermost flow channel 28 in the radially outward direction:

$abs(T_U - T_W) \leq abs(T_U - T_{FD})$, preferably $2 \cdot abs(T_U - T_W) \leq abs(T_U - T_{FD})$, in particular $10 \cdot abs(T_U - T_W) \leq abs(T_U - T_{FD})$, especially preferably $100 \cdot abs(T_U - T_W) \leq abs(T_U - T_{FD})$.

In the embodiments of the temperature control device 20 according to the invention shown in FIGS. 1 to 3, the temperature of the cylindrical wall 39 is controlled by controlling the temperature of the axial wall 30 delimiting the radially innermost flow channel 31 in the radially outward direction.

During operation, more temperature-controlling fluid is fed to the inner compartment 28b of the radially outermost flow channel 28 per unit of time than to the outer compartment 28a, preferably at least twice as much, in particular at least ten times as much, especially preferably more than a hundred times as much.

Embodiments such as those shown in FIGS. 1 to 3 significantly improve the temperature control arrangements known from the prior art and expand them by the following elements associated with the invention:

The outer compartment 28a of the radially outermost flow channel 28 is geometrically designed in these embodiments so that it is in full thermal contact both with the radially inner axial wall 30 and the radially outer axial wall 29. This outer compartment surrounds the inner compartment 28b in such a way that the inner compartment 28b is neither in thermal contact with the radially inner axial wall 30, nor with the radially outer axial wall 29. The inner compartment 28b is delimited by an axial partition 28c which, starting from the closed first axial end region 26, extends only so far in the axial direction that it is axially spaced from the second axial end region 23.

In accordance with this group of embodiments, the fluid which flows in at the fluid inlet 32 is not distributed in the radially outermost flow channel 28 and across the entire flow circumference to the second axial end region 23 (usually upwards) and then guided to the first fluid passage 34. Instead, the fluid flows in the inner compartment 28b provided according to the invention in mostly a thin, ideally thermally insulated capillary, a capillary segment or a completely circumferential capillary channel to the first fluid passage 34 and is not distributed until it arrives there. This has the consequence that the fluid, in case the intention is to heat the sample, cools only insignificantly in the inner compartment 28b on the way from the fluid inlet 32 to the second axial end region 23 (higher flow velocity+better insulation) and only cools down more when flowing through the first fluid passage 34 to the second fluid passage 36 in the interior 21, causing the sample to be colder below that above. The temperature gradient can be minimized by appropriately selecting the length of the capillary.

Two scenarios are possible for the temperature-controlling fluid that emerges from the inner compartment 28b at the second axial end region 23:

a) If the fluid that entered the fluid inlet 32 had a higher temperature than the ambient temperature $T_U$ (heating the sample), the temperature of the fluid flow through the outer compartment 28a will cool down in the direction of flow due to the full thermal contact with the outer axial wall 29. This lower temperature is passed on by the fluid by a horizontal convection to the radially inner axial wall 30 with which it is also in full thermal contact. As a result, the fluid in the outer compartment 28a impresses a temperature between the lower ambient temperature $T_U$ and the originally higher temperature of the fluid upon entry into the fluid inlet 32 on the radially inner axial wall 30.

The fluid flow thermally decoupled from the walls 29 and 30 due to the inner compartment 28b, on the other hand, will still have essentially the same—higher—temperature when it exits the inner compartment 28b at the second axial end region 23 as it did when it entered the fluid inlet 32. When the fluid passes through the first fluid passage and into the radially innermost flow channel 31, the relatively cooler radial inner axial wall 30 cools the (now reunited) fluid flow from the radially outermost flow channel 28 in the direction of flow. In the same way, cylindrical wall 39 of the interior 21 is then also temperature-controlled from the outside by the fluid flowing past by convection, like the inner axial wall 30.

If the fluid flow through the inner compartment 28b is significantly greater than the fluid flow through the outer compartment 28a, the otherwise resulting axial temperature gradient of the cylindrical wall 39 of the interior 21 is counteracted, resulting in a particularly uniform temperature distribution in the entire active volume of the NMR sample tube 22. In the best case, the gradient can even be reduced to zero.

b) If the fluid had a lower temperature than the ambient temperature $T_U$ (cooling the sample) when it entered the fluid inlet 32, this again results—with the same considerations as set out above under a) but with the opposite temperature differences relative to $T_U$—in a decrease of the absolute value of the axial temperature gradient of the cylindrical wall 39 of the interior space 21 and thus likewise in a particularly uniform temperature distribution in the entire active volume of the NMR sample tube 22.

The fluid inlet 32 can be split into a plurality of separate inlets 32', 32" with the first inlet 32' opening into the outer compartment 28a of the radially outermost flow channel 28 and the second inlet 32" into the inner compartment 28b. Preferably, the flow rate per unit of time or the temperature of the temperature-controlling fluid of the fluid flowing through the first inlet 32' into the outer compartment 28a is regulated separately from the fluid flowing through the second inlet 32" into the inner compartment 28b.

For this purpose, a valve device 37 for regulating the fluid flows through the first inlet 32' and through the second inlet 32" can be provided, as is shown in FIG. 3.

By adjusting how much fluid is distributed at the fluid inlet 32 (usually below) across the circumference of the outer compartment 28a and how much fluid flows in the inner compartment 28b to the second axial end region 23 (usually upwards), the temperature gradient can be finely adjusted (i.e., adjusted in sensitivity) across the sample or even made to disappear completely. This possibility of making the temperature gradient disappear is of great interest, in particular, in a DIFF-BB probe head used to determine a differential blood count in laboratory medicine.

The inner compartment 28b does not necessarily have to extend across the entire axial extension of the radially outermost flow channel 28 up to the first fluid passage 34. By varying the length of the inner compartment 28b, the temperature gradient of the sample can be adjusted even more sensitively. In particular, the flow contact between the inner compartment 28b and the outer compartment 28a can be variably adjusted (not shown more specifically in the drawing with respect to the embodiments of the invention).

Preferably, the axial partition 28c, which delimits the inner compartment 28b of the radially outermost flow channel 28, has recesses, in particular in the form of variably closable holes, through which flow contact can be established between the inner compartment 28b and the outer compartment 28a. This produces a virtual variability in the effective axial length of the inner compartment 28b.

FIGS. 4A to 4C show various geometric design options for the inner compartment 28b of the radially outermost flow channel 28:

In FIG. 4A, the inner compartment 28b comprises a plurality of (preferably evenly distributed) individual capillaries arranged around the z-axis.

In the embodiment according to FIG. 4B, the inner compartment 28b is designed as a completely radially circumferential capillary channel with a closed axial intermediate wall 28c. In order to enable an exchange of fluid between the area outside and inside the capillary channel, through openings that are closed toward the inner compartment are possible. These are not, however, shown in greater detail in the drawing.

FIG. 4C shows a variant in which the inner compartment 28b is formed by a plurality of capillary segments that are arranged around the z-axis and are each closed themselves.

In embodiments of the temperature control device according to the invention, which are not shown in greater detail in the drawing, a heating device and/or a cooling device can be connected to the axial wall 30 in a thermally conductive manner.

FIGS. 5A and 5B each show the temperature profile in the sample along the z-axis with FIG. 5A showing an arrangement according to prior art and FIG. 5B showing a temperature control device designed according to the invention. The invention reduces the absolute temperature swing by an entire order of magnitude, which contributes significantly to a correspondingly increased temperature stability in the NMR sample tube. The invention also makes it possible to reverse the temperature gradient.

In summary, the present invention describes possibilities for improving the temperature control (cooling or heating) of an NMR sample tube with the fluid flow operating in accordance with the countercurrent principle setting the lowest possible temperature gradient directly at the sample tube. An important difference to the known prior art lies in the special type of temperature control of the cylindrical wall 39 delimiting the interior 21 in the radially outward direction, in particular by controlling the temperature of the axial wall 30 delimiting the radially innermost flow channel 31 in the radially outward direction.

The features of all the above-described embodiments of the invention may also be combined with one another at least in most cases.

LIST OF REFERENCES

Documents taken into consideration for the assessment of patentability
[1] DE 10 2010 029 080 B4, U.S. Pat. No. 8,847,595 B2
[2] DE 10 2012 217 601 B4, U.S. Pat. No. 9,482,729 B2
[3] DE 40 18 734 C2, U.S. Pat. No. 5,192,910 A

LIST OF REFERENCE SIGNS

20 Temperature control device
21 Interior
22 NMR sample tube
23 Second axial end region
24 Opening in the upper terminating piece
25 Upper terminating piece
26 First axial end region
27 Lower terminating piece
28 Radially outermost flow channel
28a Outer compartment
28b Inner compartment
28c Axial partition
29 Radially outer axial wall
30 Radially inner axial wall
31 Radially innermost flow channel
32 Fluid inlet
32' First inlet to the outer compartment
32" Second inlet to the inner compartment
33 Shared inlet
34 First fluid passage
35 Fluid outlet
36 Second fluid passage to the interior
37 Valve device
39 The cylindrical wall delimiting the interior in the radially outward direction
z Longitudinal axis of the NMR sample tube in the NMR measurement mode

What is claimed is:

1. A method for controlling temperature of a nuclear-magnetic-resonance (NMR) sample tube comprising:
providing a temperature control device in which, around an interior delimited in a radially outward direction by a cylindrical wall, a plurality of flow channels for a temperature-controlling fluid running radially around the interior are formed for receiving the NMR sample tube, of which a radially outermost one of the flow channels is delimited by an axial wall and a radially innermost one of the flow channels is delimited by a further axial wall, each to the radially outward direction, wherein adjacent ones of the flow channels are each connected to one another by a first fluid passage at one axial end with the radially innermost flow channel, wherein the radially innermost flow channel comprises a second fluid passage to the interior, wherein the radially outermost flow channel comprises a fluid inlet at one axial end, and wherein the temperature-controlling fluid is guided through the flow channels, and during operation of the temperature control device, temperature controlling the cylindrical wall delimiting the interior in the radially outward direction with the temperature-controlling fluid such that the following relation in absolute values applies to the temperature $T_W$ of the cylindrical wall and the temperature $T_{FD}$ of the temperature-controlling fluid at the first fluid passage in relation to the ambient temperature $T_U$ radially outside the axial wall delimiting the radially outermost flow channel in the radially outward direction:

$$\text{abs}(T_U - T_W) \leq \text{abs}(T_U - T_{FD}).$$

2. The method according to claim 1, further comprising: controlling the temperature of the cylindrical wall by controlling the temperature of the axial wall delimiting the radially innermost flow channel in the radially outward direction.

3. The method according to claim 1, wherein: $2 \cdot \text{abs}(T_U - T_W) \leq \text{abs}(T_U - T_{FD})$.

4. The method according to claim 3, wherein: $10 \cdot \text{abs}(T_U - T_W) \leq \text{abs}(T_U - T_{FD})$.

5. The method according to claim 4, wherein: $100 \cdot \text{abs}(T_U - T_W) \leq \text{abs}(T_U - T_{FD})$.

6. The method according to claim 1, wherein the radially outermost flow channel comprises an outer compartment and an inner compartment in which the temperature-controlling fluid flows in a single direction, further comprising:

during the operation, feeding more temperature-controlling fluid per unit of time to the inner compartment of the radially outermost flow channel than is fed to the outer compartment.

7. The method according to claim 6, wherein at least more than one hundred times as much temperature-controlling fluid per unit of time is fed to the inner compartment of the radially outermost flow channel than is fed to the outer compartment.

8. The method according to claim 6, wherein the fluid inlet is split into at least two separate inlets, wherein the first inlet opens into the outer compartment of the radially outermost flow channel and the second inlet opens into the inner compartment, and wherein a ratio of quantities of the fluid per unit of time that are guided through the first inlet and through the second inlet is regulated.

9. A temperature control device for an NMR sample tube and provided as claimed in the method according to claim 1, further comprising:

a heating device and/or a cooling device thermally connected to the axial wall.

10. A temperature control device for an NMR sample tube, comprising:

around an interior delimited in a radially outward direction by a cylindrical wall, a plurality of flow channels for a temperature-controlling fluid running radially around the interior and formed for receiving the NMR sample tube, of which a radially outermost one of the flow channels, which is delimited by axial walls, comprises an outer compartment and an inner compartment, in which the temperature-controlling fluid flows in a single direction, wherein the temperature control device is formed in a first axial end region to be closed to the interior and in an opposite, second axial end region to be open to the interior, for introducing the NMR sample tube into the interior, wherein adjacent flow channels in a counterflow area are each connected to one another with a first fluid passage at one axial end such that a flow direction of a fluid flow in the radially outermost flow channel to an adjacent, radially innermost one of the flow channels reverses in a countercurrent area, wherein the radially outermost flow channel comprises a fluid inlet at one axial end, wherein the radially innermost flow channel, which is delimited by the axial walls, comprises a second fluid passage to the interior at an axial end which faces the closed first axial end region, wherein the outer compartment of the radially outermost flow channel is geometrically designed to be in full thermal contact with both the radially inner axial wall and the radially outer axial wall, wherein the outer compartment surrounds the inner compartment of the radially outermost flow channel such that the inner compartment is in thermal contact neither with the radially inner axial wall nor with the radially outer axial wall, and wherein the inner compartment of the radially outermost flow channel is delimited by an axial partition which, starting from the closed first axial end region, extends in the axial direction only so far as to be spaced apart from the second axial end region.

11. The temperature control device according to claim 10, wherein the outer compartment of the radially outermost flow channel is designed so that the flow rate of the temperature-controlling fluid through the outer compartment is less than through the inner compartment.

12. The temperature control device according to claim 11, wherein the outer compartment of the radially outermost flow channel is designed so that the flow rate of the temperature-controlling fluid through the outer compartment is at least ten times less than the flow rate through the inner compartment.

13. The temperature control device according to claim 10, wherein the outer compartment of the radially outermost flow channel has a larger flow cross section transversely to the flow direction of the temperature-controlling fluid than does the inner compartment.

14. The temperature control device according to claim 13, wherein the flow cross section of the outer compartment of the radially outermost flow channel is at least ten times as large as is the flow cross-section of the inner compartment.

15. The temperature control device according to claim 10, wherein the outer compartment and the inner compartment of the radially outermost flow channel are designed so that an average flow rate of the temperature-controlling fluid through the outer compartment of the radially outermost flow channel is smaller than through the inner compartment.

16. The temperature control device according to claim 15, wherein the outer compartment and the inner compartment of the radially outermost flow channel are designed so that the average flow rate of the temperature-controlling fluid through the outer compartment of the radially outermost flow channel is at least ten times less than through the inner compartment.

17. The temperature control device according to claim 10, wherein a flow contact between the inner compartment and the outer compartment of the radially outermost flow channel is configured to be variable.

18. The temperature control device according to claim 17, wherein the flow contact between the inner compartment and the outer compartment of the radially outermost flow channel is varied with the axial partition, which delimits the inner compartment of the radially outermost flow channel, via recesses formed as variably closable holes through which flow contact is established between the inner compartment and the outer compartment.

19. The temperature control device according to claim 10, wherein the axial partition, which delimits the inner compartment of the radially outermost flow channel, is configured to provide thermal insulation from the outer compartment and has a heat transfer coefficient of less than 4 $W/(m^2K)$.

20. The temperature control device according to claim 10, wherein the inner compartment of the radially outermost flow channel is configured as a capillary with a closed partition, as a capillary segment or as a completely radially circumferential capillary channel.

21. The temperature control device according to claim 10, wherein the fluid inlet is split into at least two separate inlets, wherein the first inlet opens into the outer compartment of the radially outermost flow channel and the second inlet opens into the inner compartment.

22. The temperature control device according to claim 21, wherein a flow rate per unit of time or a temperature of the temperature-controlling fluid of the fluid flowing through the first inlet into the outer compartment is regulated separately from the fluid flowing through the second inlet into the inner compartment.

23. The temperature control device according to claim 21, further comprising a valve device for regulating the fluid flows through the first inlet and through the second inlet.

* * * * *

UNITED STATES PATENT AND TRADEMARK OFFICE
CERTIFICATE OF CORRECTION

| | |
|---|---|
| PATENT NO. | : 11,933,867 B2 |
| APPLICATION NO. | : 17/720473 |
| DATED | : March 19, 2024 |
| INVENTOR(S) | : Schmidig |

It is certified that error appears in the above-identified patent and that said Letters Patent is hereby corrected as shown below:

On the Title Page

Page 2 item (56) Foreign Patent Documents, delete "JP 855131758 A" and insert -- JP S55131758 A --.

Signed and Sealed this
Twentieth Day of August, 2024

Katherine Kelly Vidal
*Director of the United States Patent and Trademark Office*